United States Patent
Yang et al.

(10) Patent No.: US 11,063,156 B1
(45) Date of Patent: Jul. 13, 2021

(54) MEMORY DEVICE AND MANUFACTURING METHOD THEREOF

(71) Applicant: Powerchip Semiconductor Manufacturing Corporation, Hsinchu (TW)

(72) Inventors: Wen Chung Yang, Miaoli County (TW); Shih Hsi Chen, Hsinchu County (TW); Wei-Chang Lin, Hsinchu (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 0 days.

(21) Appl. No.: 16/858,746

(22) Filed: Apr. 27, 2020

(30) Foreign Application Priority Data

Mar. 18, 2020 (TW) .................. 10910894.3

(51) Int. Cl.
| H01L 29/788 | (2006.01) |
| H01L 27/11521 | (2017.01) |
| H01L 21/28 | (2006.01) |
| H01L 29/423 | (2006.01) |
| H01L 29/66 | (2006.01) |

(52) U.S. Cl.
CPC .... H01L 29/7883 (2013.01); H01L 27/11521 (2013.01); H01L 29/40114 (2019.08); H01L 29/42336 (2013.01); H01L 29/66825 (2013.01)

(58) Field of Classification Search
CPC .............................................. H01L 21/823481
See application file for complete search history.

(56) References Cited

U.S. PATENT DOCUMENTS

| 5,796,151 A | 8/1998 | Hsu et al. |
| 6,198,144 B1 | 3/2001 | Pan et al. |
| 2009/0068816 A1* | 3/2009 | Eun .................... H01L 21/76232 438/425 |
| 2009/0170283 A1* | 7/2009 | Sheen ............... H01L 27/11521 438/437 |
| 2012/0126306 A1 | 5/2012 | Kawaguchi et al. |

FOREIGN PATENT DOCUMENTS

| TW | 201924028 | 6/2019 |
| TW | 202008513 | 2/2020 |
| WO | 2006012163 | 2/2006 |

OTHER PUBLICATIONS

"Office Action of Taiwan Counterpart Application", dated Nov. 9, 2020, p. 1-p. 9.

* cited by examiner

Primary Examiner — Xiaoming Liu
(74) Attorney, Agent, or Firm — JCIPRNET

(57) ABSTRACT

A memory device and a manufacturing method of the memory device are provided. The manufacturing method includes steps below. A plurality of stack structures including a tunneling dielectric layer and a floating gate are formed on a substrate. A liner material layer including a nitride liner layer is formed on the substrate. A top surface of the nitride liner layer is lower than a top surface of the floating gate and is higher than a top surface of the tunneling dielectric layer. An isolation material layer covering the liner material layer is formed on the substrate. The isolation material layer is oxidized, and a portion of the isolation material layer is removed to form an isolation structure. An inter-gate dielectric layer covering the stack structures and the isolation structure is formed on the substrate. A control gate covering the inter-gate dielectric layer is formed on the substrate.

17 Claims, 5 Drawing Sheets

MEMORY DEVICE AND MANUFACTURING METHOD THEREOF

CROSS-REFERENCE TO RELATED APPLICATION

This application claims the priority benefit of Taiwan application serial no. 109108943, filed on Mar. 18, 2020. The entirety of the above-mentioned patent application is hereby incorporated by reference herein and made a part of this specification.

BACKGROUND

Technical Field

The disclosure relates to a semiconductor device and a manufacturing method thereof, and particularly to a memory device and a manufacturing method thereof.

Description of Related Art

A typical memory device is generally designed to include a structure with a plurality of memory cells, each of which includes a tunneling dielectric layer, a floating gate, an inter-gate layer, and a control gate sequentially disposed on a substrate. In addition, an isolation structure is disposed between adjacent memory cells. In a manufacturing process of the isolation structure, a flowable isolation material layer is generally formed first, and then an oxidation process and an etching process are performed on the isolation material layer. The oxidation process enables the resultant isolation structure to have a higher proportion of oxygen atoms and achieve good isolation effects. However, oxygen introduced in the oxidation process may diffuse to the tunneling dielectric layer, so that part of the substrate and/or the floating gate closer to the tunneling dielectric layer are/is oxidized to cause Bird's Beak, which leads to poor electrical performance of the memory cells.

To solve the above problems, an oxide liner layer may be disposed on a sidewall of the stack structures to prevent oxygen from diffusing to the tunneling dielectric layer. However, in the manufacturing process of the isolation structure, an annealing process may be performed to cure the isolation material layer. The annealing process causes nitrogen atoms in the nitride liner layer to diffuse into the isolation material layer, resulting in an uneven internal structure of the isolation material layer. Therefore, in the subsequent etching process performed on the isolation material layer to form a recess filled with the control gate, an etching rate of each part of the isolation material layer is different, and thus the resultant recess may have an uneven surface. In view of the above, the gate coupling ratio between the control gate filling the recess and the floating gate is unstable, and a distribution width of a critical voltage of the memory cells also increases significantly, which also leads to poor electrical performance of the memory cells.

SUMMARY

The disclosure is directed to a memory device and a manufacturing method thereof, and the resultant memory device has good electrical performance.

According to an embodiment of the disclosure, a manufacturing method of a memory device includes following steps. Firstly, a substrate is provided. A plurality of stack structures are formed on the substrate. The substrate has a trench, and the trench is located between adjacent stack structures. Each of the stack structures includes a tunneling dielectric layer and a floating gate, and the tunneling dielectric layer is disposed between the floating gate and the substrate. A liner material layer including a first oxide liner material layer, a nitride liner layer, and a second oxide liner material layer is formed on the substrate. The first oxide liner material layer covers the stack structures, the nitride liner layer and the second oxide liner material layer are disposed on the first oxide liner material layer, and the second oxide liner material layer is located above the nitride liner layer. An isolation material layer covering the liner material layer is formed on the substrate, and the isolation material layer fills the trench. A first oxidation process is performed on the isolation material layer, and a portion of the isolation material layer is removed to form an isolation structure. An inter-gate dielectric layer is formed on the substrate, and the inter-gate dielectric layer covers the stack structures and the isolation structure. A control gate is formed on the substrate, and the control gate covers the inter-gate dielectric layer.

In an embodiment of the disclosure, a top surface of the nitride liner layer is lower than a top surface of the floating gate, and the top surface of the nitride liner layer is higher than a top surface of the tunneling dielectric layer.

In an embodiment of the disclosure, the step of forming the liner material layer on the substrate includes following steps. The first oxide liner material layer covering the stack structures is formed on the substrate. A nitride liner material layer covering the first oxide liner material layer is formed on the substrate. A protective material layer covering the nitride liner material layer is formed on the substrate, and the protective material layer fills the trench. A portion of the protective material layer is removed to form a passivation layer, and the passivation layer exposes a portion of the nitride liner material layer. A second oxidation process is performed on the exposed portion of the nitride liner material layer. The passivation layer is removed.

In an embodiment of the disclosure, the second oxidation process includes a low-temperature plasma oxidation process.

In an embodiment of the disclosure, the material of the protective material layer includes an organic polymer.

In an embodiment of the disclosure, a method of forming the isolation material layer includes spin coating.

In an embodiment of the disclosure, the first oxidation process includes a steam oxidation process.

In an embodiment of the disclosure, the step of removing the portion of the isolation material layer includes following steps. A planarization process is performed on the isolation material layer to expose a portion of the liner material layer. A back-etching process is performed on the isolation material layer to form a recess between adjacent stacked structures. A bottom surface of the recess is not lower than a top surface of the nitride liner layer.

In an embodiment of the disclosure, the control gate fills the recess.

In an embodiment of the disclosure, before the liner material layer is formed on the substrate, the manufacturing method further includes disposing a hard mask layer on each of the stack structures.

According to an embodiment of the disclosure, a memory device includes a plurality of stack structures, a liner layer, an isolation structure, an inter-gate dielectric layer, and a control gate. The stack structures are disposed on a substrate. Each of the stack structures includes a tunneling dielectric layer and a floating gate, and the tunneling dielectric layer is disposed between the floating gate and the substrate. The liner layer is disposed on a partial sidewall of the stack structures. The liner layer includes a first oxide liner layer, a nitride liner layer, and a second oxide liner layer. The first oxide liner layer is in contact with the partial sidewall of the stack structures, the nitride liner layer and the second oxide liner layer are in contact with each other and disposed on the first oxide liner layer, and the second oxide liner layer is located above the nitride liner layer. The isolation structure is disposed on two sides of the stack structures. The inter-gate dielectric layer is disposed on the substrate and covers the stack structures and the isolation structure. The control gate is disposed on the substrate and covers the inter-gate dielectric layer.

In an embodiment of the disclosure, a top surface of the nitride liner layer is lower than a top surface of the floating gate, and the top surface of the nitride liner layer is higher than a top surface of the tunneling dielectric layer.

In an embodiment of the disclosure, the liner layer is further disposed on a partial sidewall of the substrate.

In an embodiment of the disclosure, the material of the first oxide liner layer includes silicon oxide, the material of the nitride liner layer includes silicon nitride, and the material of the second oxide liner layer includes silicon oxide.

In an embodiment of the disclosure, a top surface of the isolation structure is lower than a top surface of the floating gate.

In an embodiment of the disclosure, the inter-gate dielectric layer includes a composite layer of a silicon oxide layer and a silicon nitride layer, and the inter-gate dielectric layer is conformally disposed on the substrate.

In an embodiment of the disclosure, the material of the control gate includes doped polysilicon, undoped polysilicon, or a combination thereof.

Based on the above, in the manufacturing method of the memory device as provided in one or more embodiments of the disclosure, Bird's Beak may be prevented by disposing the nitride liner layer. In addition, according to the memory device and the manufacturing method of the memory device as provided in one or more embodiments of the disclosure, the top surface of the nitride liner layer is lower than the top surface of the floating gate, so that nitrogen atoms in the nitride liner layer may be prevented from diffusing into the isolation material layer to be removed subsequently in the oxidation process of the isolation material layer, and then the recess with the even surface may be formed after the isolation material layer is removed. Accordingly, the gate coupling ratio between the control gate and the floating gate in the memory device may be stable in one or more embodiments of the disclosure. In addition, a distribution width of a critical voltage of the memory cells in the memory device provided herein may be reduced significantly to achieve good electrical performance.

In order to make the aforementioned and other features and advantages provided in the disclosure invention comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments provided in the disclosure and, together with the description, serve to explain the inventive principles.

DESCRIPTION OF THE EMBODIMENTS

FIG. 1A to FIG. 1J are schematic views of a manufacturing method of a memory device according to an embodiment of the disclosure.

Figure 1A:
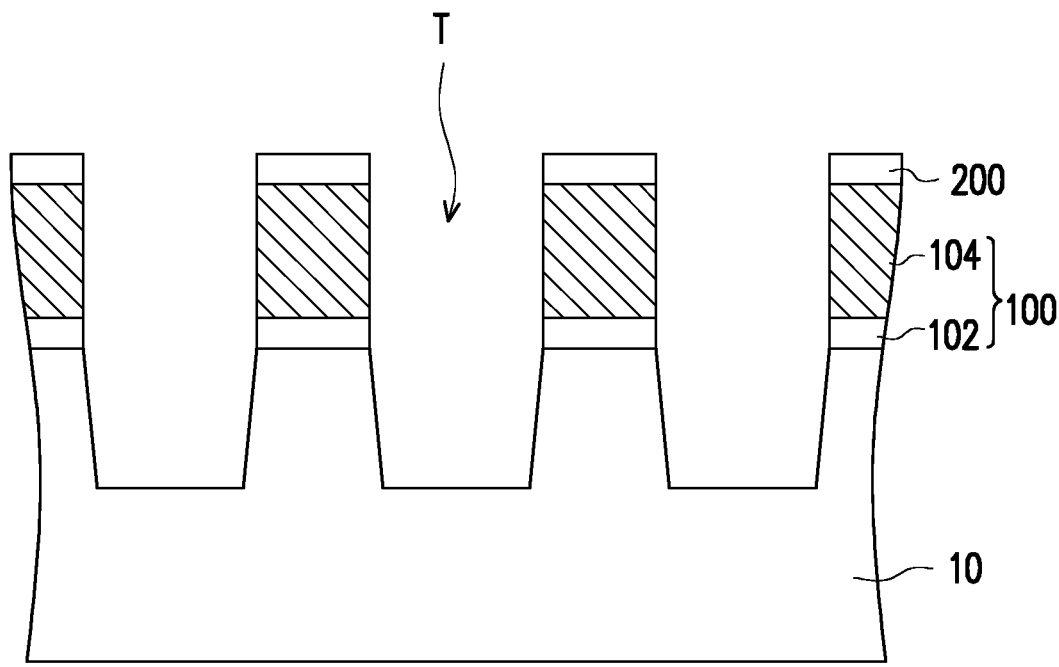
FIG. 1A to FIG. 1J are schematic views of a manufacturing method of a memory device according to an embodiment of the disclosure.

As shown in FIG. 1A, a substrate 10 is provided. The substrate 10 is, for example, a semiconductor substrate, a semiconductor compound substrate, or a semiconductor over insulator (SOI). The semiconductors are, for example, Group IVA atoms, such as silicon or germanium. The semiconductor compounds are, for example, semiconductor compounds formed by Group IVA atoms, for example, silicon carbide or germanium silicide, or semiconductor compounds formed by Group IIIA atoms and Group VA atoms, such as gallium arsenide.

Still referring to FIG. 1A, next, a plurality of stack structures 100 are formed on the substrate 10. In the present embodiment, each stack structure 100 includes a tunneling dielectric layer 102 and a floating gate 104. In some embodiments, a hard mask layer 200 may be further disposed on an upper side of the stack structure 100. The material of the tunneling dielectric layer 102 includes, for example, silicon oxide, the material of the floating gate 104 includes, for example, doped polysilicon, undoped polysilicon, or a combination thereof, and the material of the hard mask layer 200 includes, for example, silicon nitride. In some embodiments, the plurality of stack structures 100 may be formed by the following process, but it should be noted that the disclosure is not limited thereto. Firstly, a tunneling dielectric material layer (not shown), a floating gate material layer (not shown), and a hard mask material layer (not shown) may be sequentially formed on the substrate 10. In some embodiments, the tunneling dielectric material layer may be formed by thermal oxidation, and the floating gate material layer and the hard mask material layer may be formed by chemical vapor deposition. Thereafter, the hard mask material layer, the floating gate material layer, and the tunneling dielectric material layer are patterned sequentially. So far, the stack structure 100 including the tunneling dielectric layer 102 and the floating gate 104 and the hard mask layer 200 have been formed. In addition, the substrate 10 is also patterned to form a plurality of trenches T in the substrate 10. From another perspective, the trenches T are, for example, disposed between adjacent stack structures 100.

Figure 1B:
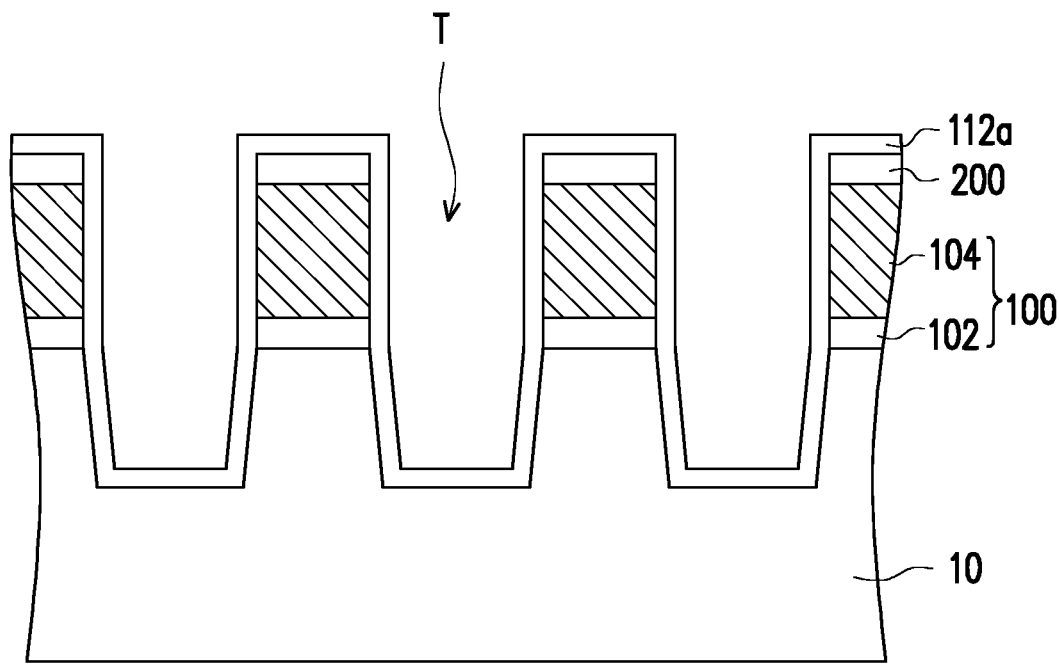

Referring to FIG. 1B, a first oxide liner material layer 112a is formed on the substrate 10. The first oxide liner material layer 112a is, for example, conformally formed on the substrate 10. In detail, the first oxide liner material layer 112a, for example, covers the stack structures 110 and disposed on a surface of the trenches T. In some embodiments, the material of the first oxide liner material layer 112a includes silicon oxide. The first oxide liner material layer 112a is formed by, for example, thermal oxidation, but the disclosure is not limited thereto. For example, the first oxide liner material layer 112a may also be formed by atomic layer deposition or in-situ steam generation (ISSG).

Figure 1C:
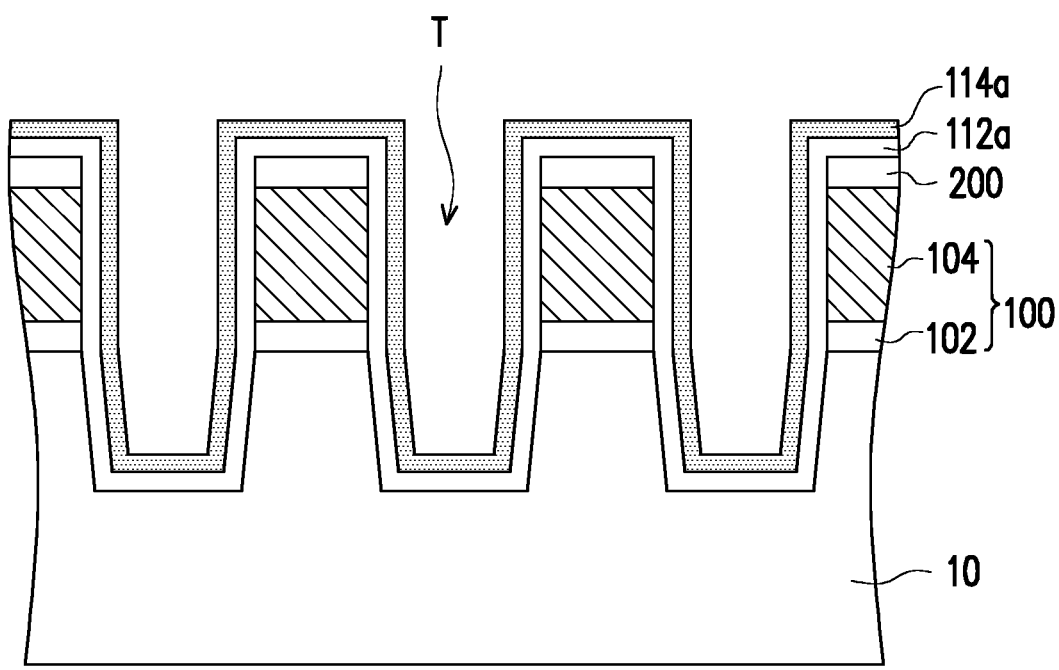

Referring to FIG. 1C, a nitride liner material layer 114a is formed on the substrate 10. The nitride liner material layer 114a is also, for example, conformally formed on the substrate 10. In detail, the nitride liner material layer 114a, for example, covers the stack structures 100 and is disposed on a surface of the first oxide liner material layer 112a. In some embodiments, the material of the nitride liner material layer 114a includes silicon oxide. The nitride liner material layer 114a is formed by, for example, chemical vapor deposition, but the disclosure is not limited thereto. For example, the nitride liner material layer 114a may also be formed by nitriding the first oxide liner material layer 112a.

Figure 1D:
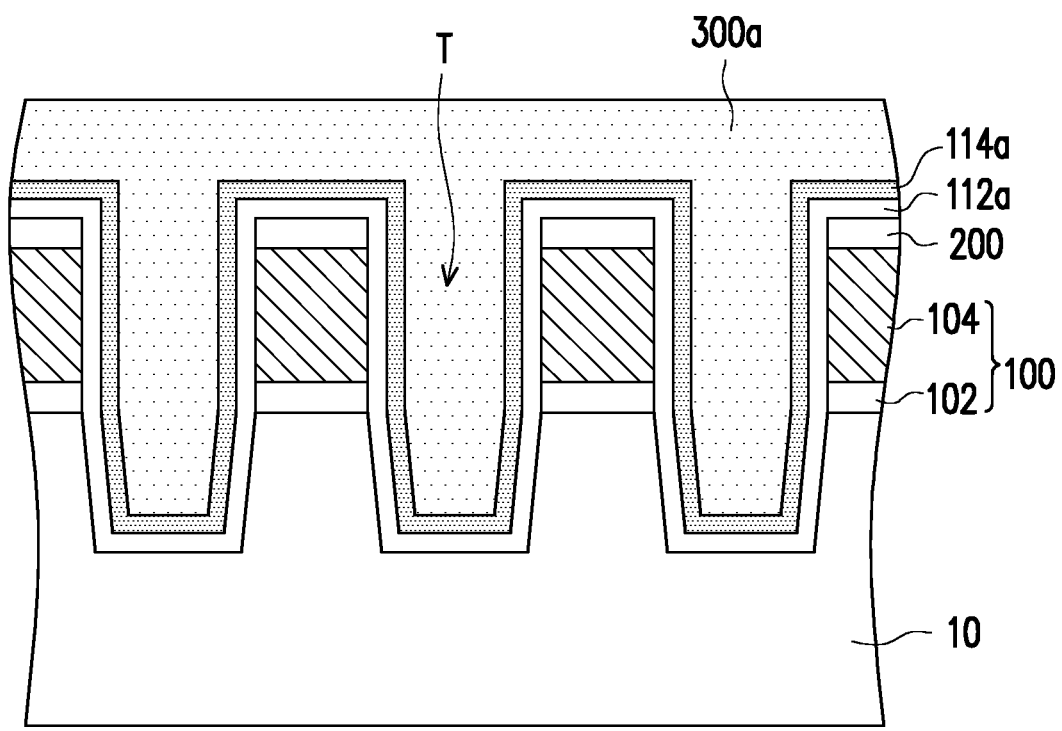

Referring to FIG. 1D, a protective material layer 300a is formed on the substrate 10. The protective material layer 300a, for example, covers the nitride liner material layer 114a and fills the trenches T. In some embodiments, the material of the protective material layer 300a is a photoresist material, which is, for example, an organic polymer. The protective material layer 300a is formed by, for example, spin coating, but the disclosure is not limited thereto.

Figure 1E:
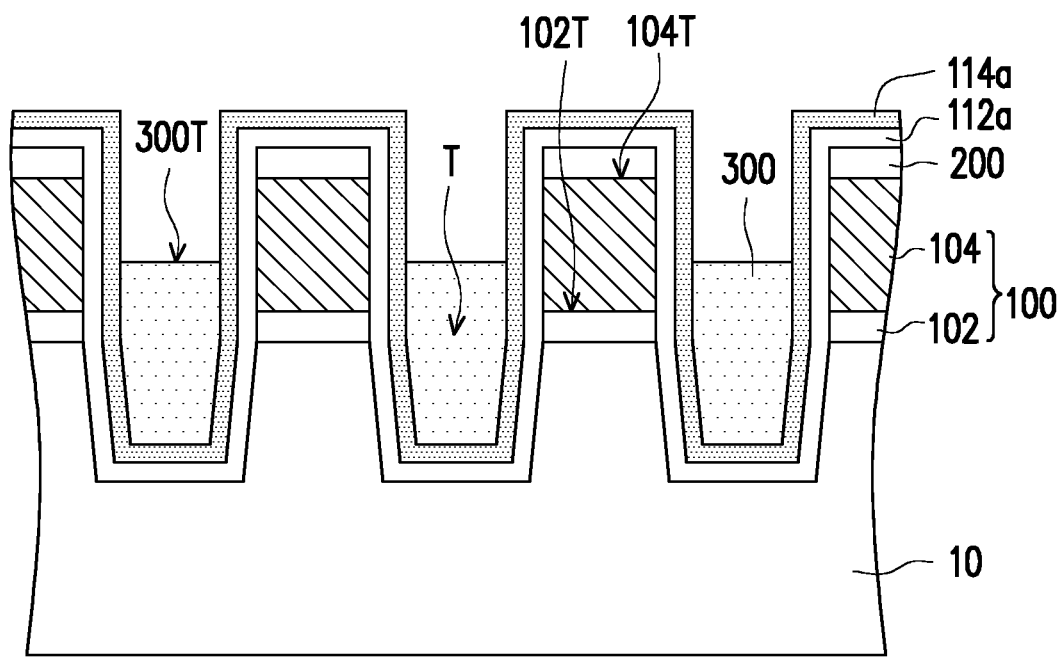

Referring to FIG. 1E, a portion of the protective material layer 300a is removed to form a passivation layer 300. In some embodiments, a portion of the protective material layer 300a may be removed by performing a back-etching process. The back-etching process may include a wet-etching process, a dry-etching process, or a combination thereof. For example, the portion of the protective material layer 300a may be removed by performing a wet-etching process. The wet-etching process uses, for example, buffer hydrofluoric acid, diluted hydrofluoric acid, or other suitable etching solutions, which has a high etching selectivity for the protective material layer 300a and the nitride liner material layer 114a. In the present embodiment, the resultant passivation layer 300 exposes a portion of the nitride liner material layer 114a. In addition, the passivation layer 300 is at a level between the tunneling dielectric layer 102 and the floating gate 104. In detail, a top surface 300T of the passivation layer 300 is, for example, lower than a top surface 104T of the floating gate 104 (i.e., a top surface of the stack structure 100), and the top surface 300T of the passivation layer 300 is, for example, higher than a top surface 102T of the tunneling dielectric layer 102.

Figure 1F:
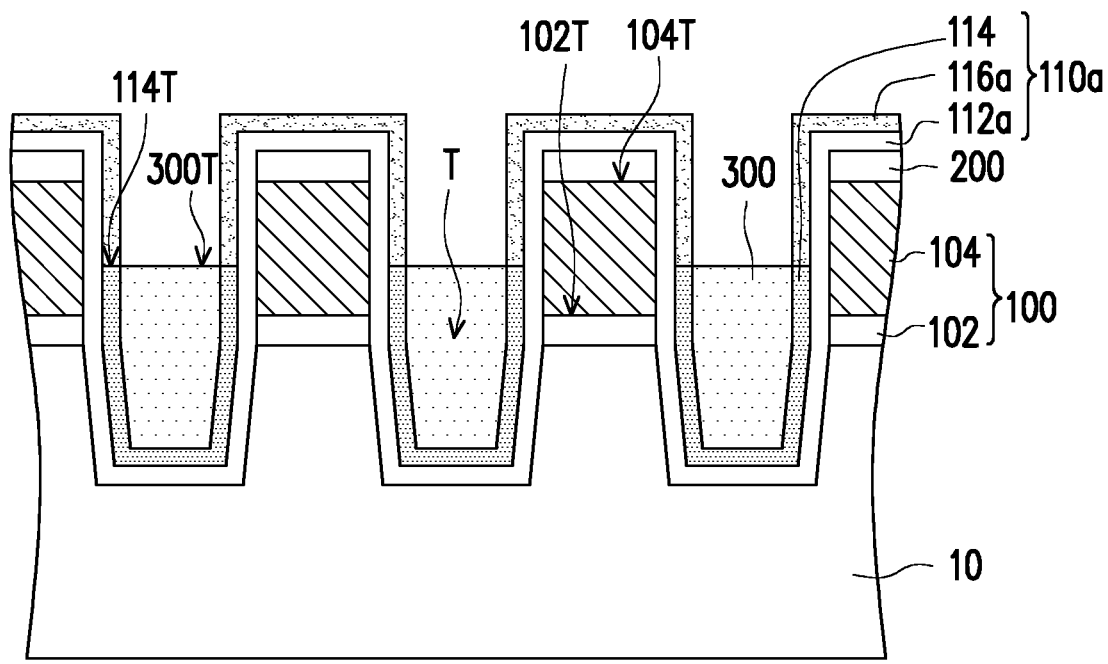

Referring to FIG. 1F, a second oxide liner material layer 116a is formed on the substrate 10. In the present embodiment, the second oxide liner material layer 116a is formed by oxidizing the portion of the nitride liner material layer 114a exposed by the passivation layer 300. For example, a low-temperature plasma oxidation process may be performed to convert nitrogen atoms included therein into oxygen atoms. Based on this, the material of the second oxide liner material layer 116a includes, for example, silicon oxide. In addition, after the second oxide liner material layer 116a is formed, a nitride liner layer 114 is also formed, that is, the nitride liner layer 114 is another portion of the nitride liner material layer 114a unoxidized, and the second oxide liner material layer 116a is located above the nitride liner layer 114. In some embodiments, a top surface 114T of the nitride liner layer 114 is essentially flush with the top surface 300T of the passivation layer 300. So far, a liner material layer 110a including the first oxide liner material layer 112a, the nitride liner layer 114, and the second oxide liner material layer 116a has been formed on the substrate 10.

Figure 1G:
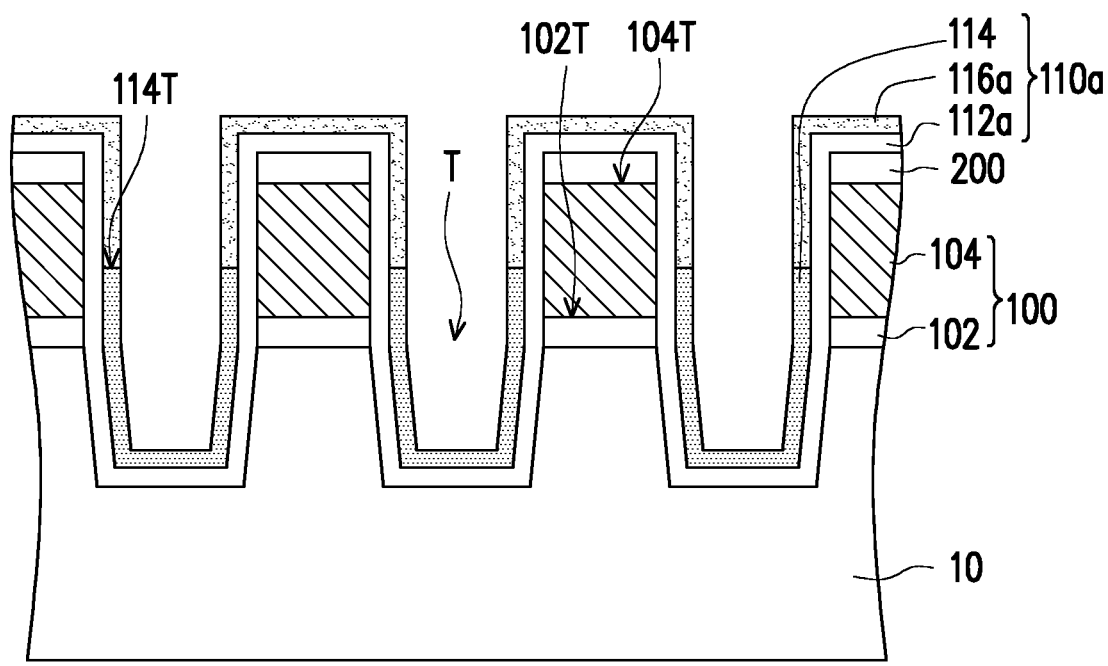

Referring to FIG. 1G, the passivation layer 300 is removed. In some embodiments, the passivation layer 300 may be formed by performing a back-etching process. The back-etching process may include a wet-etching process, a dry-etching process, or a combination thereof. For example, a portion of the passivation layer 300 may be removed by performing a wet-etching process. After the passivation layer 300 is removed, the nitride liner layer 114 in the trenches T may be exposed.

Figure 1H:
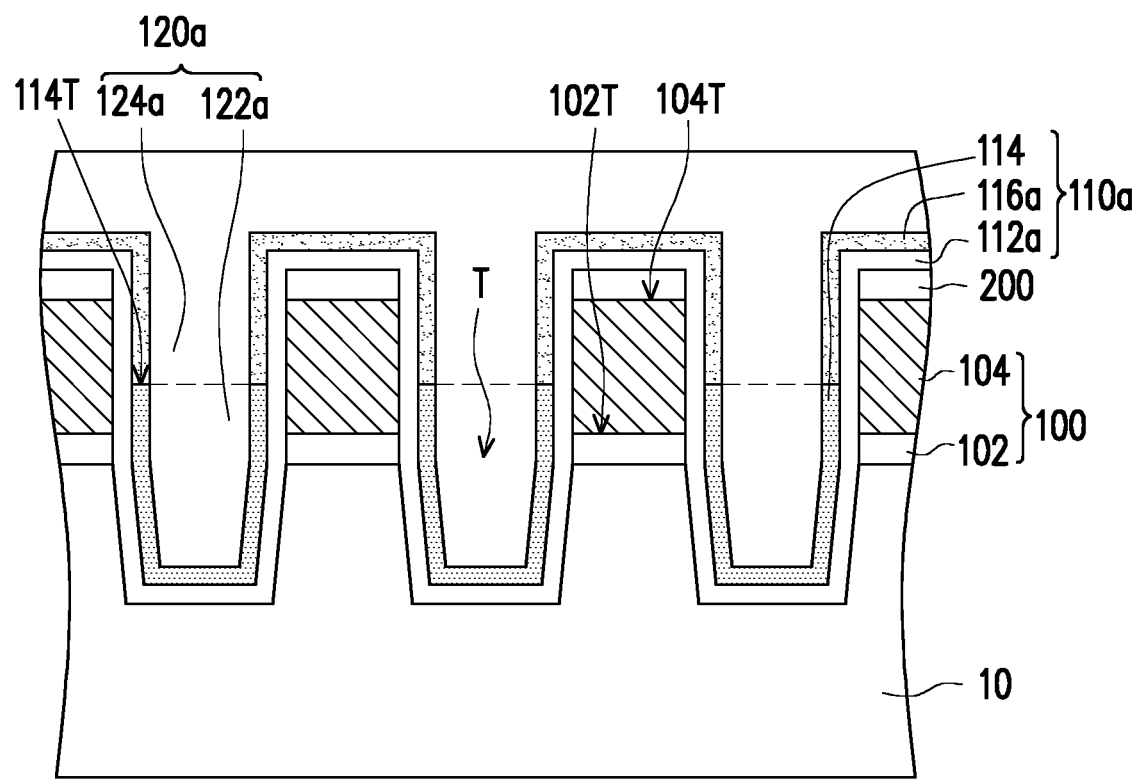

Referring to FIG. 1H, an isolation material layer 120a is formed on the substrate 10. The isolation material layer 120a, for example, covers the nitride liner layer 114 and the second oxide liner material layer 116a and fills the trenches T. For example, the isolation material layer 120a at a low level is in contact with the nitride liner layer 114, and the isolation material layer 120a at a high level is in contact with the second oxide liner material layer 116a. In detail, the resultant isolation material layer 120a may include a first isolation material layer 122a and a second isolation material layer 124a, where the first isolation material layer 122a is in contact with the nitride liner layer 114, and the second isolation material layer 124a is in contact with the second oxide liner material layer 116a. In some embodiments, the material of the isolation material layer 120a may be a flowable insulation material to avoid the formation of a plurality of voids due to the failure to fill the trenches T. In some embodiments, the material of the isolation material layer 120a may include silicon oxide. The isolation material layer 120a is formed by, for example, spin coating at first to form a SiCNO-containing isolation material layer (not shown). Thereafter, a steam oxidation process is performed on the SiCNO-containing isolation material layer to increase a ratio of oxygen atoms in the SiCNO-containing isolation material layer and to reduce a ratio of carbon atoms to nitrogen atoms (i.e., most carbon atoms and nitrogen atoms are converted to oxygen atoms), thereby providing a better insulation effect. In addition, the steam oxidation process also solidifies the isolation material layer. So far, the isolation material layer 120a has been formed by performing the above process. It is worth noting that the steam oxidation process includes introducing hydrogen and oxygen into the SiCNO-containing isolation material layer to increase the ratio of the oxygen atoms thereof. Since the nitride liner layer 114 is disposed on a sidewall of the tunneling dielectric layer 102 in the present embodiment, the oxygen atoms may be prevented from diffusing to the tunneling dielectric layer 102 to avoid Bird's Beak. In addition, the steam oxidation process includes solidifying the SiCNO-containing isolation material layer by performing an annealing process to thus form the isolation material layer 120a. The annealing process diffuses part of the nitrogen atoms in the nitride liner layer 114 to the first isolation material layer 122a in contact therewith. In contrast, since the second isolation material layer 124a is not in contact with the nitride liner layer 114 and may not be doped with excess nitrogen atoms, when at least one portion of the second isolation material layer 124a is subsequently removed to form a recess, an uneven surface of the recess caused by different etching rates of respective parts may be avoided.

Figure 1I:
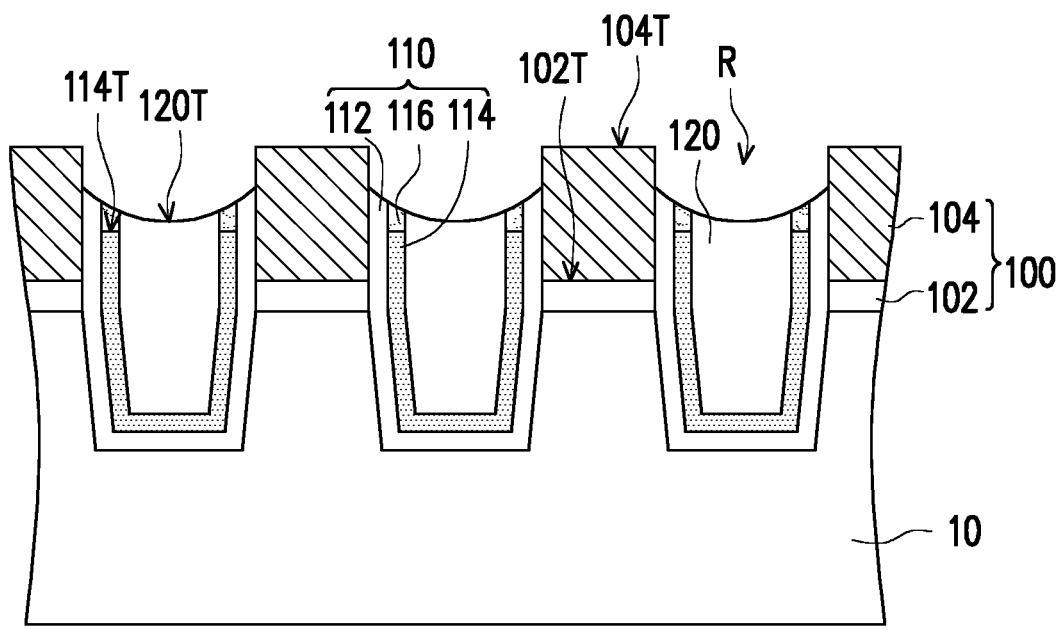

Referring to FIG. 1I, a portion of the isolation material layer 120a is removed to form an isolation structure 120. In detail, in the present embodiment, at least one portion of the second isolation material layer 124a in contact with the second oxide liner material layer 116 is removed. In some embodiments, a portion of the isolation material layer 120a may be removed by performing a planarization process first and then performing a back-etching process. The planarization process is, for example, a chemical mechanical polishing process, and the back-etching process may include a wet-etching process, a dry-etching process, or a combination thereof. The planarization process may be performed until, for example, at least a top surface of the liner material layer 110a is exposed. In the present embodiment, the planarization process is performed till a top surface of the hard mask layer 200 is exposed to remove a portion of the isolation material layer 120a, the second oxide liner material layer 116a, and the first oxide liner material layer 112a. Thereafter, the back-etching process is resumed on the isolation material layer 120a to form a recess R between adjacent stack structures 100. So far, the isolation structure 120 is formed. In addition, when the back-etching process is performed on the isolation material layer 120a, a portion of the first oxide liner material layer 112a and a portion of the second oxide liner material layer 116a on sidewalls of the stack structures 100 are also removed at the same time to form a first oxide liner layer 112 and a second oxide liner layer 116 respectively. In the present embodiment, since the first isolation material layer 122a in contact with the nitride liner layer 114 is not removed, a bottom surface of the recess R is not lower than the top surface 114T of the nitride liner layer 114. In addition, as described in the above embodiment, since the second isolation material layer 124a is not doped with excess nitrogen atoms, at least one portion of the second isolation material layer 124a may be removed by a back-etching process at a uniform etching rate, so that the resultant recess R may have a smooth surface (i.e., the isolation structure 120 has a smooth top surface 120T). In the present embodiment, the hard mask layer 200 is removed after at least one portion of the second isolation material layer 124a in contact with the second oxide liner material layer 116a is removed.

Figure 1J:
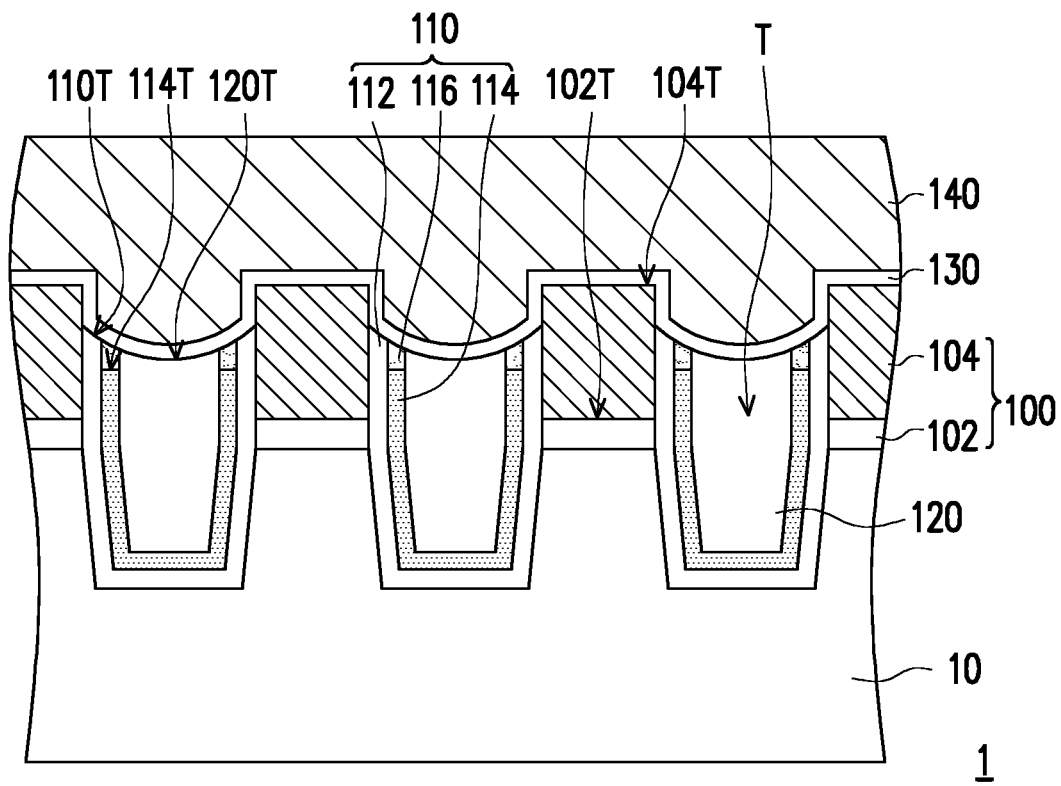

Referring to FIG. 1J, an inter-gate dielectric layer 130 and a control gate 140 are sequentially formed on the substrate 10. The inter-gate dielectric layer 130 is, for example, conformally formed on the substrate 10. In detail, the inter-gate dielectric layer 130 may cover the stack structures 100 and be disposed on a surface of the recess R. In some embodiments, the inter-gate dielectric layer 130 includes a composite layer of a silicon oxide layer and a silicon nitride layer. The inter-gate dielectric layer 130 is formed by, for example, chemical vapor deposition, but the disclosure is not limited thereto. After the inter-gate dielectric layer 130 is formed, the control gate 140 is formed on the inter-gate dielectric layer 130. The control gate 140 fills, for example, the recess R between the adjacent stack structures 100 to increase a coupling area between the control gate 140 and the floating gate 104, thereby increasing a gate coupling ratio between the control gate 140 and the floating gate 104. In addition, since the recess R has a smooth surface, there may be a stable gate coupling ratio between the control gate 140 and the floating gate 104, and a distribution width of a critical voltage of memory cells (which includes, for example, the floating gate 104, the tunneling dielectric layer 102, the inter-gate dielectric layer 130, and the control gate 140) may be reduced obviously. In some embodiments, the material of the control age 140 may be, for example, doped polysilicon, undoped polysilicon, or a combination thereof. The control gate 140 is formed by, for example, physical vapor deposition or chemical vapor deposition, but the disclosure is not limited thereto.

So far, the memory device 1 of the disclosure has been manufactured.

Although the manufacturing method of the memory device 1 of the present embodiment is described with the above method, the method of forming the memory device 1 of the disclosure is not limited thereto.

Still referring to FIG. 1J, FIG. 1J is a schematic partial view of a memory device 1 according to an embodiment of the disclosure. The memory device 1 according to an embodiment of the disclosure includes a substrate 10, stack structures 100, a liner layer 110, an isolation structure 120, an inter-gate dielectric layer 130, and a control gate 140.

The stack structures 100 are disposed, for example, on the substrate 10, trenches T are located between adjacent stack structures 100, and the trenches T may extend into the substrate 10. In some embodiments, each of the stack structures 100 includes a tunneling dielectric layer 102 and a floating gate 104, where the tunneling dielectric layer 102 and the floating gate 104 are sequentially stacked on a top surface of the substrate 10, i.e., the tunneling dielectric layer 102 is located between the floating gate 104 and the substrate 10.

The liner layer 110 is located, for example, in the trenches T and disposed on a partial surface of the trenches T. In detail, the liner layer 110 may be disposed on a sidewall of part of the stack structures 100 and a sidewall of part of the substrate 10. In some embodiments, a top surface 110T of the liner layer 110 is lower than a top surface 104T of the floating gate 104. In the present embodiment, the liner layer 110 includes a first oxide liner layer 112, a nitride liner layer 114, and a second oxide liner layer 116. The first oxide liner layer 112 is in contact with, for example, a sidewall of part of the stack structures 100 and a sidewall and a bottom of part of the substrate 10. In some embodiments, the material of the first oxide liner layer 112 is silicon oxide. The nitride liner layer 114 is disposed, for example, on a partial surface of the first oxide liner layer 112, where a top surface 114T of the nitride liner layer 114 is lower than, for example, the top surface 104T of the floating gate 104, and the top surface 114T of the nitride liner layer 114 is higher than, for example, a top surface 102T of the tunneling dielectric layer 102. In some embodiments, the material of the nitride liner layer 114 is silicon nitride. The second oxide liner layer 116 is also disposed, for example, on the partial surface of the first oxide liner layer 112, and in contact with the nitride liner layer 114. In detail, the second oxide liner layer 116 is disposed above the nitride liner layer 114. In some embodiments, the material of the second oxide liner layer 116 is silicon oxide.

The isolation structure 120 is located, for example, in the trenches T and disposed on two sides of the stack structures 100. In detail, the isolation structure 120 fills part of the trenches T. In the present embodiment, the isolation structure 120 is a shallow trench isolation (STI). A top surface 120T of the isolation structure 120 is lower than, for example, the top surface 104T of the floating gate 104, and the top surface 120T of the isolation structure 120 is higher than, for example, the top surface 102T of the tunneling dielectric layer 102. In some embodiments, the material of the isolation structure 120 is silicon oxide.

The inter-gate dielectric layer 130 is disposed, for example, on the substrate 10 and covers the stack structure 100 and the isolation structure 120. In the present embodiment, the inter-gate dielectric layer 130 is conformally formed on the substrate 10, i.e., the inter-gate dielectric layer 130 may be formed in the trenches T. In some embodiments, the inter-gate dielectric layer 130 includes a composite layer of a silicon oxide layer and a silicon nitride layer. For example, the inter-gate dielectric layer 130 may include a three-layer structure including an oxide layer (not shown), a nitride layer (not shown), and an oxide layer (not shown), where the three-layer structure including an oxide layer, a nitride layer, and an oxide layer are sequentially stacked on the stack structures 100 and the isolation structure 110.

The control gate 140 is disposed, for example, on the substrate 10 and covers the inter-gate dielectric layer 130. In the present embodiment, the control gate 140 may fill the trenches T. In addition, in the present embodiment, since the top surface 120T of the isolation structure 120 is lower than the top surface 104T of the floating gate 104 and the inter-gate dielectric layer 130 is conformally formed on the substrate 10, a coupling area between the control gate 140 and the floating gate 104 may be increased accordingly, thereby increasing a gate coupling ratio between the control gate 140 and the floating gate 104; as a result, the memory device 1 of the present embodiment has better efficiency. In addition, as described in the above embodiment, the isolation structure of the present embodiment has a smooth top surface 120T, so that the gate coupling ratio between the overlying control gate 140 and floating gate 104 is stable.

Based on the above, the memory device and the manufacturing method thereof as provided in one or more embodiments of the disclosure can prevent diffusion of oxygen atoms into the tunneling dielectric layer caused by an oxidation process on the insulating material layer through the setting of the nitride liner layer, thereby avoiding Bird's Beak. In addition, by converting a portion of the nitride liner material layer (in contact with the removed second isolation material layer in the subsequent process) into an oxide liner material layer, the memory device and the manufacturing method thereof as provided in one or more embodiments of the disclosure can prevent diffusion of nitride atoms in the nitride liner material layer into the second isolation material layer when an oxidation process is performed on the isolation material layer, thereby preventing the second isolation material layer from having an uneven structure due to the doping of excess nitrogen atoms. Accordingly, after the subsequent etching process, the second isolation material layer enables the resultant trenches to have a smooth surface due to essentially the same etching rate of various parts, thereby leading to a stable gate coupling ratio between the control gate and the floating gate subsequently formed. In addition, a distribution width of a critical voltage of the memory cells included in the memory device of the disclosure can be reduced obviously for good electrical performance.

Although the disclosure has been described with reference to the above embodiments, it will be apparent to one of ordinary skill in the art that modifications to the described embodiments may be made without departing from the spirit of the disclosure. Accordingly, the scope provided in the disclosure is defined by the attached claims not by the above detailed descriptions.

What is claimed is:

1. A manufacturing method of a memory device, comprising:
    providing a substrate, wherein a plurality of stack structures are formed on the substrate, the substrate has a trench, and the trench is located between adjacent stack structures of the plurality of stack structures, wherein each of the plurality of stack structures comprises a tunneling dielectric layer and a floating gate, and the tunneling dielectric layer is disposed between the floating gate and the substrate;
    forming a liner material layer comprising a first oxide liner material layer, a nitride liner layer, and a second oxide liner material layer on the substrate, wherein the first oxide liner material layer covers the plurality of stack structures, the nitride liner layer and the second oxide liner material layer are in contact with each other and both directly disposed on the first oxide liner material layer, and the second oxide liner material layer is located above the nitride liner layer;
    forming an isolation material layer covering the liner material layer on the substrate, wherein the isolation material layer fills the trench and is in direct contact with the nitride liner layer and the second oxide liner material layer;
    performing a first oxidation process on the isolation material layer and removing a portion of the isolation material layer to form an isolation structure;
    forming an inter-gate dielectric layer on the substrate, wherein the inter-gate dielectric layer covers the plurality of stack structures and the isolation structure; and
    forming a control gate on the substrate, wherein the control gate covers the inter-gate dielectric layer.

2. The manufacturing method according to claim 1, wherein a top surface of the nitride liner layer is lower than a top surface of the floating gate, and the top surface of the nitride liner layer is higher than a top surface of the tunneling dielectric layer.

3. The manufacturing method according to claim 2, wherein the step of forming the liner material layer on the substrate comprises:
    forming the first oxide liner material layer on the substrate, the first oxide liner material layer covering the plurality of stack structures;
    forming a nitride liner material layer on the substrate, the nitride liner material layer covering the first oxide liner material layer;
    forming a protective material layer on the substrate, the protective material layer covering the nitride liner material layer, wherein the protective material layer fills the trench;
    removing a portion of the protective material layer to form a passivation layer, wherein the passivation layer exposes a portion of the nitride liner material layer;
    performing a second oxidation process on the exposed portion of the nitride liner material layer; and
    removing the passivation layer.

4. The manufacturing method according to claim 3, wherein the second oxidation process comprises a low-temperature plasma oxidation process.

5. The manufacturing method according to claim 3, wherein the material of the protective material layer comprises an organic polymer.

6. The manufacturing method according to claim 1, wherein a method of forming the isolation material layer comprises spin coating.

7. The manufacturing method according to claim 1, wherein the first oxidation process comprises a steam oxidation process.

8. The manufacturing method according to claim 1, wherein the step of removing the portion of the isolation material layer comprises:
    performing a planarization process on the isolation material layer to expose a portion of the liner material layer; and
    performing a back-etching process on the isolation material layer to form a recess between adjacent stacked structures of the plurality of stacked structures, wherein a bottom surface of the recess is not lower than a top surface of the nitride liner layer.

9. The manufacturing method according to claim 8, wherein the control gate fills the recess.

10. The manufacturing method according to claim 8, before forming the liner material layer on the substrate, further comprising disposing a hard mask layer on each of the plurality of stack structures.

11. A memory device, comprising:
    a plurality of stack structures, disposed on a substrate, wherein each of the plurality of stack structures comprises a tunneling dielectric layer and a floating gate, and the tunneling dielectric layer is disposed between the floating gate and the substrate;

a liner layer, disposed on a partial sidewall of the plurality of stack structures, wherein the liner layer comprises a first oxide liner layer, a nitride liner layer, and a second oxide liner layer, the first oxide liner layer is in contact with the partial sidewall of the plurality of stack structures, the nitride liner layer and the second oxide liner layer are in contact with each other and both directly disposed on the first oxide liner layer, and the second oxide liner layer is located above the nitride liner layer;

an isolation structure, disposed on two sides of the plurality of stack structures and being in direct contact with the nitride liner layer and the second oxide liner layer;

an inter-gate dielectric layer, disposed on the substrate and covering the plurality of stack structures and the isolation structure; and a control gate, disposed on the substrate and covering the inter-gate dielectric layer.

12. The memory device according to claim 11, wherein a top surface of the nitride liner layer is lower than a top surface of the floating gate, and the top surface of the nitride liner layer is higher than a top surface of the tunneling dielectric layer.

13. The memory device according to claim 11, wherein the liner layer is further disposed on a partial sidewall of the substrate.

14. The memory device according to claim 11, wherein the material of the first oxide liner layer comprises silicon oxide, the material of the nitride liner layer comprises silicon nitride, and the material of the second oxide liner layer comprises silicon oxide.

15. The memory device according to claim 11, wherein a top surface of the isolation structure is lower than a top surface of the floating gate.

16. The memory device according to claim 11, wherein the inter-gate dielectric layer comprises a composite layer of a silicon oxide layer and a silicon nitride layer, and the inter-gate dielectric layer is conformally disposed on the substrate.

17. The memory device according to claim 11, wherein the material of the control gate comprises doped polysilicon, undoped polysilicon, or a combination thereof.

* * * * *